(12) United States Patent
Gunn, III et al.

(10) Patent No.: US 7,616,904 B1
(45) Date of Patent: Nov. 10, 2009

(54) WAVEGUIDE PHOTODETECTOR WITH INTEGRATED ELECTRONICS

(75) Inventors: Lawrence C. Gunn, III, Encinitas, CA (US); Thierry J. Pinguet, Cardiff by the Sea, CA (US); Maxime Jean Rattier, Paris (FR); Giovanni Capellini, Rome (IT)

(73) Assignee: Luxtera, Inc., Carlsbad, CA (US)

(*) Notice: Subject to any disclaimer, the term of this patent is extended or adjusted under 35 U.S.C. 154(b) by 61 days.

(21) Appl. No.: 11/710,162

(22) Filed: Feb. 23, 2007

Related U.S. Application Data

(62) Division of application No. 10/600,563, filed on Jun. 19, 2003, now Pat. No. 7,453,132.

(60) Provisional application No. 60/389,962, filed on Jun. 19, 2002, provisional application No. 60/391,277, filed on Jun. 24, 2002, provisional application No. 60/432,925, filed on Dec. 12, 2002, provisional application No. 60/433,470, filed on Dec. 13, 2002.

(51) Int. Cl.
*H01L 31/0232* (2006.01)

(52) U.S. Cl. .............. 398/214; 257/448; 257/431; 257/432

(58) Field of Classification Search .............. 398/214
See application file for complete search history.

(56) References Cited

U.S. PATENT DOCUMENTS

| | | | | |
|---|---|---|---|---|
| 3,442,583 A | * | 5/1969 | Rottmann | 353/34 |
| 5,280,189 A | * | 1/1994 | Schuppert et al. | 257/458 |
| 5,442,205 A | * | 8/1995 | Brasen et al. | 257/191 |
| 5,708,739 A | * | 1/1998 | Patton | 385/37 |
| 5,783,839 A | * | 7/1998 | Morikawa et al. | 257/21 |
| 5,793,913 A | * | 8/1998 | Kovacic | 385/49 |
| 5,915,051 A | * | 6/1999 | Damask et al. | 385/16 |
| 6,075,253 A | * | 6/2000 | Sugiyama et al. | 257/19 |
| 6,154,475 A | * | 11/2000 | Soref et al. | 372/45.011 |
| 6,222,951 B1 | * | 4/2001 | Huang | 385/14 |
| 6,391,214 B1 | * | 5/2002 | Kovacic | 216/24 |
| 2002/0172464 A1 | * | 11/2002 | Delwala | 385/40 |
| 2003/0027409 A1 | * | 2/2003 | Ramdani et al. | 438/481 |
| 2003/0161571 A1 | * | 8/2003 | Davids et al. | 385/14 |
| 2003/0176075 A1 | * | 9/2003 | Khan et al. | 438/714 |
| 2004/0056243 A1 | * | 3/2004 | Atanackovic et al. | 257/19 |
| 2005/0053347 A1 | * | 3/2005 | West et al. | 385/129 |
| 2006/0039666 A1 | * | 2/2006 | Knights et al. | 385/129 |

* cited by examiner

*Primary Examiner*—Minh-Loan T Tran
*Assistant Examiner*—Fei Fei Yeung Lopez
(74) *Attorney, Agent, or Firm*—Fernandez & Associates, LLP

(57) ABSTRACT

A germanium on silicon waveguide photodetector disposed on a silicon on insulator (SOI) substrate. The photodetector is incorporated into a section of a planar silicon waveguide on the substrate. The photodetector generates an electric current as an infrared optical signal travels through the photodetector.

6 Claims, 9 Drawing Sheets

WAVEGUIDE PHOTODETECTOR WITH INTEGRATED ELECTRONICS

CROSS-REFERENCE TO RELATED APPLICATIONS

This application is a divisional of U.S. patent application Ser. No. 10/600,563 filed on Jun. 19, 2003 now U.S. Pat. No. 7,453,132, which claims priority from U.S. Provisional applications No. 60/389,962 filed Jun. 19, 2002, No. 60/391,277 filed Jun. 24, 2002, No. 60/432,925 filed Dec. 12, 2002 and No. 60/433,470 filed Dec. 13, 2002.

FIELD OF THE INVENTION

The present invention relates to a semiconductor waveguide photodetector and its use in a monolithic integrated circuit for the conversion of optical signals to electrical signals.

BACKGROUND OF THE INVENTION

The rapid expansion in the use of the Internet has resulted in a demand for high speed communications links and devices, including optical links and devices. Optical links using fiber optics have many advantages compared to electrical links: large bandwidth, high noise immunity, reduced power dissipation and minimal crosstalk. Optoelectronic integrated circuits made of silicon are highly desirable since they could be fabricated in the same foundries used to make VLSI integrated circuits. Optical communications technology is typically operating in the 1.3 µm and 1.55 µm infrared wavelength bands. The optical properties of silicon are well suited for the transmission of optical signals, due to its transparency in the infrared wavelength bands of 1.3 µm and 1.55 µm and its high refractive index. As a result, low loss planar silicon optical waveguides have been successfully built.

A silicon based waveguide is just one of many components needed to make an integrated optoelectronic circuit. An optical signal received by an optoelectronic circuit has in many cases to be converted to an electronic signal for further processing by electronic circuits. Conversion of optical signals to electronic signals can be achieved by a photodetector. Silicon, due to its bandgap of 1.12 eV, cannot be used to make photodetectors for infrared band signals, because it is transparent to light at wavelengths above 1.1 µm. Silicon's transparency to infrared light makes it ideal for use as a planar waveguide on an integrated circuit, but eliminates it from use as an infrared photodetector.

Hybrid and integrated optoelectronics have been built with photodetectors made of III-V type semiconductors such as InGaAs, but these devices are difficult to integrate into a silicon chip. SiGe alloys have potential as infrared photodetectors, but primarily in the 1.3 µm wavelength band. Germanium in bulk form has been used as a photodetector in the infrared band, due to its bandgap of 0.66 eV. Making a germanium on silicon photodetector has been difficult, due to the large lattice mismatch, of about 4% for pure germanium on silicon.

After conversion of an optical signal to an electronic signal, the low level electrical signal needs to be amplified and processed by associated electronic circuits. The electronic circuits are typically built on a silicon chip. Due to the lack of useable silicon based IR photodetectors, such optoelectronic conversion is typically performed by hybrid circuits, which are much more expensive than monolithic integrated circuits.

SUMMARY OF THE INVENTION

One embodiment of the present invention is a germanium on silicon waveguide photodetector disposed on a silicon on insulator (SOI) substrate. The photodetector is incorporated into a section of a planar silicon waveguide on the substrate. The photodetector generates an electric current as an infrared optical signal travels through the photodetector.

An alternate embodiment of the present invention is a chip for integrating an optoelectronic converter. An optical signal is connected to a planar waveguide on the chip through an optical coupling. The waveguide has along its length, a germanium on silicon waveguide photodetector, which generates an electric current as an infrared optical signal propagates through the photodetector. Electronic circuits, such as CMOS circuits, on the same chip convert the electric current to a digital signal. The digital signal can be further processed in the digital domain on the same chip or sent to other chips.

DETAILED DESCRIPTION

Figure 1:
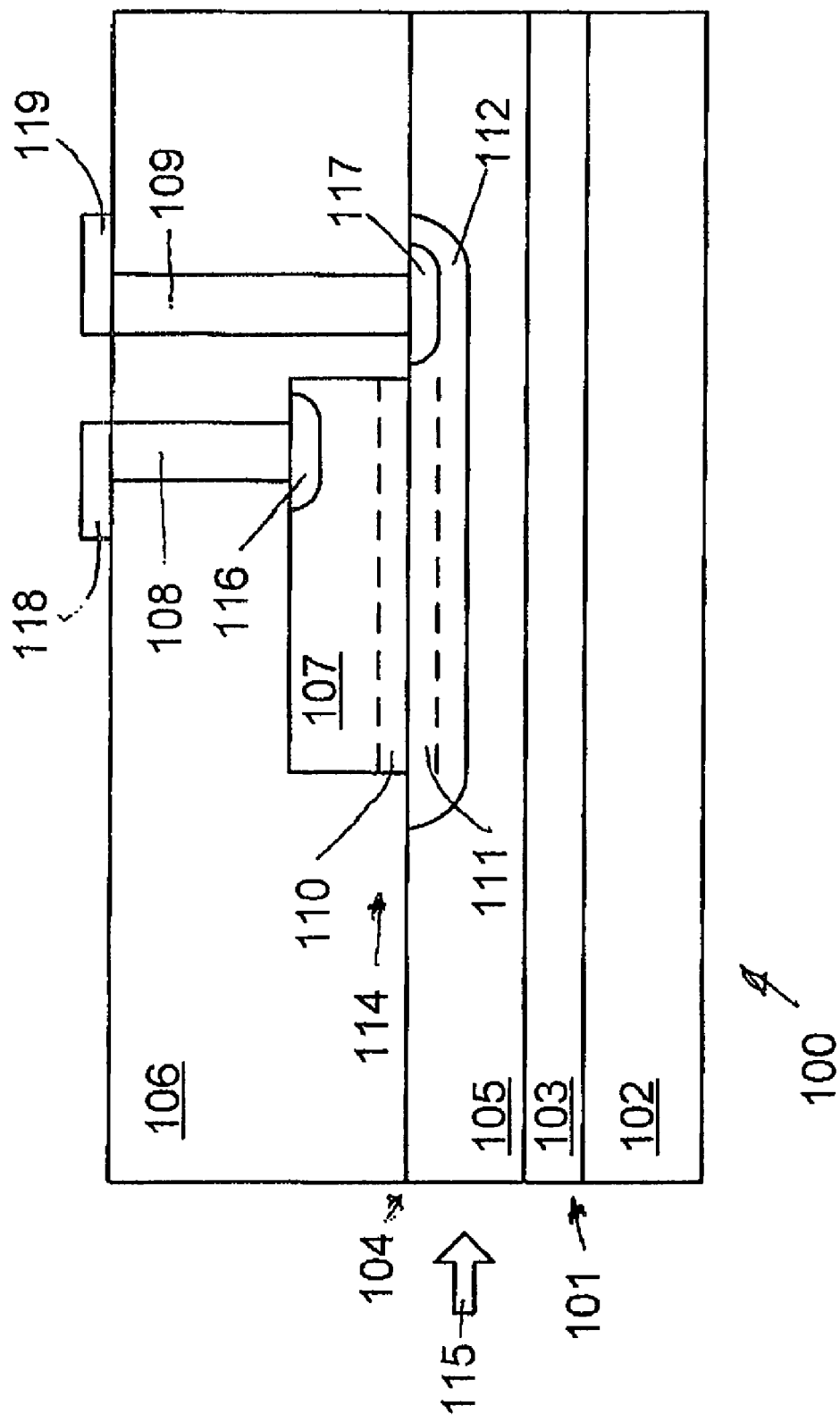
FIG. 1 is a side view of a waveguide photodetector, according to one embodiment of the present invention.

FIG. 1 is a side view of a waveguide photodetector 100, not to scale, according to a preferred embodiment of the present invention. The substrate 101 is made of silicon dioxide layer 103 on top of silicon layer 102. A silicon planar waveguide 104 receives an optical signal 115 from a source, not shown, to the left of the photodetector.

The waveguide 104 is made of a silicon core 105 and surrounded by cladding in the form of one or more dielectric layers. The cladding includes the silicon dioxide layer 103 underneath the silicon core and the dielectric films 106. On top of the waveguide core 105, is a layer of germanium 107. A germanium on silicon heterojunction is formed by the germanium layer 107 on top of the silicon core 105 of the waveguide 104. The waveguide core and heterojunction are surrounded on their sides and from above by one or more dielectric cladding layers 106. The dielectric layers 106 can also be referred to as inter-layer dielectric films. Some of the dielectric layers are typically made of silicon dioxide.

The germanium layer 107 is preferably P doped. The silicon core 105 of the waveguide 104 includes a preferably N doped region 112. A depletion region 114 is made of germanium depletion region 110 and silicon depletion region 111.

Ohmic contacts 116 and 117, typically of metal silicide, such as cobalt silicide are fabricated, respectively in the germanium 107 and silicon 112. Conductive plug 108 connects the ohmic contact 116 to the metal segment 118, which is part of the first metal layer (M1). Conductive plug 109 connects the ohmic contact 117 to the metal segment 119, which is part of the first metal layer (M1). Each of the conductive plugs 109 and 108 can be each made of multiple conductive plugs. Each of the multiple conductive plugs can be connected to the first metal layer of an integrated circuit.

A particularly advantageous aspect of the waveguide photodetectors of the present invention is the increased electric current generated due to the use of multiple conductive plugs 109 to the ohmic contact 116 on the germanium 107 and the use of multiple conductive plugs 110 to the ohmic contact 117 on the silicon 112.

In one embodiment of the present invention, during fabrication of the photodetector 100, an N type impurity is introduced into region 112 of the silicon core 105 of the waveguide 104; and P type dopants are introduced into region 110 of the germanium layer 107. The N doped region 112 extends to the left and to the right of the top surface of the waveguide core 105 in contact with the germanium layer 107. The N doped region 112 of the waveguide preferably extends far enough to the right of the germanium 107, opposite the light input, to provide space for the ohmic contacts 117.

A germanium on silicon heterojunction is formed by the contact of the germanium P layer 107 with the silicon N region 112. The germanium on silicon heterojunction forms a waveguide core which receives an optical signal at its input from the waveguide 104. Depletion region 114 can be made of two layers: the germanium depletion region 110 and the silicon depletion region 111. The depletion region 114 has no charge carriers and an electric field exists within the depletion region 114. As infrared light 115 travels through the waveguide photodetector 100 from left to right, some of the light enters into the germanium layer 107. The silicon depletion region 111 is transparent to infrared but the germanium depletion region 110 absorbs infrared light.

When infrared light enters into the germanium depletion region 110, the absorption of the photons generates electron hole pairs. Within the depletion region 114, there is an electric field which separates the photon generated electron hole pairs. The holes travel into the P doped region from the depletion region 114. The electrons travel into the N doped region from the depletion region 114. The motion of the holes and electrons out of the depletion region 114 causes a current to flow in the photodetector 100 and through ohmic contacts 116 and 117. The resulting electric current is proportional to the intensity of the infrared light 115 traveling through the waveguide 104. The photodetector 100 operates as a pin diode and is typically reverse biased.

The collection efficiency of the photodetector can be improved by delivering as much of the power of the optical signal into the germanium depletion region 110, where photons are converted into electron hole pairs.

Waveguide 104 in a preferred embodiment is typically 0.5 µm wide and 0.2 µm high. The waveguide width can vary from 0.1 to 10.0 µm. The waveguide height can vary from 0.1 µm to 1.0 µm.

The large difference between the high refractive index (n) of about 3.5 for silicon as compared to the much lower refractive index of about 1.5 for silicon dioxide, confines the light to the core with minimal leakage through the cladding, provides a very small bending radius of about 10 µm and thus saves space on the chip.

The germanium 107 in a preferred embodiment is typically made of a 200 nm layer of monocrystalline germanium, which is 0.5 µm wide and 25 µm long. The monocrystalline germanium layer can have a thickness of from 10 nm to 1000 nm. The germanium 107 can be narrower or wider than the waveguide core 105 underneath the germanium. In alternate embodiments, the germanium 107 is made of polycrystalline germanium.

The depletion region 114 in a preferred embodiment typically has a thickness of 30 nm. The depletion region 114 can vary from 0.0 µm to 1.0 µm in thickness. The small size of the total junction area and the narrow thickness of the depletion region 114 reduces the capacitance of the junction, and makes practical high speed operation.

The waveguide 104 and the germanium 107 together form waveguide photodetector 100 with a combined optical thickness of the core 105 and the germanium 107. The optical thickness of the waveguide is increased, because of the transmission of light into the germanium 107 from the silicon waveguide 104. Germanium has a refractive index of about 4.2 and the silicon core 105 has a refractive index of about 3.5. As light propagates through the core 105 next to the germanium 107, some light passes into the germanium 107, because the refractive indices of the germanium 107 and silicon core 105 are close enough to allow light to pass through a germanium—silicon boundary.

When a single mode optical signal reaches the input or leading edge of the photodetector 100, the optical signal is transformed into multiple modes, due to the transmission of light into the germanium 107.

Figure 2:
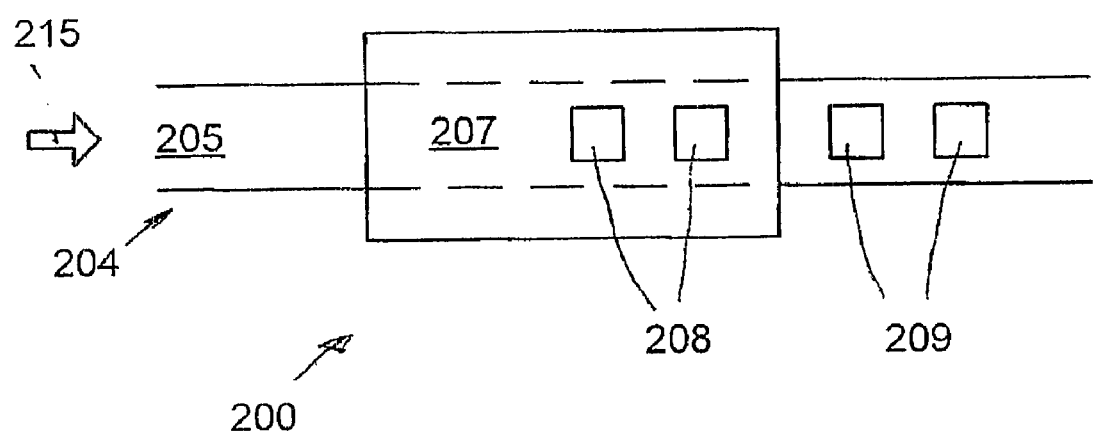
FIG. 2 is a top view of a waveguide photodetector, according to one embodiment of the present invention.

FIG. 2 is a top view of a waveguide photodetector 200, not to scale, according to an embodiment of the present invention. Optical signal 215 is propagated in waveguide 204. A plurality of conductive plugs 208 connect to an ohmic contact in germanium 207. A plurality of conductive plugs 209 are made into an ohmic contact in the doped region of the silicon core 205 of the waveguide 204 on the far side of the photodetector 200. To increase the sensitivity of the photodetector 200, a plurality of conductive plugs 208 and 209 are used to increase the amount of electric current picked up from the photodetector 200. The germanium 207 can be narrower or wider than the width of the waveguide 204.

Figure 3:
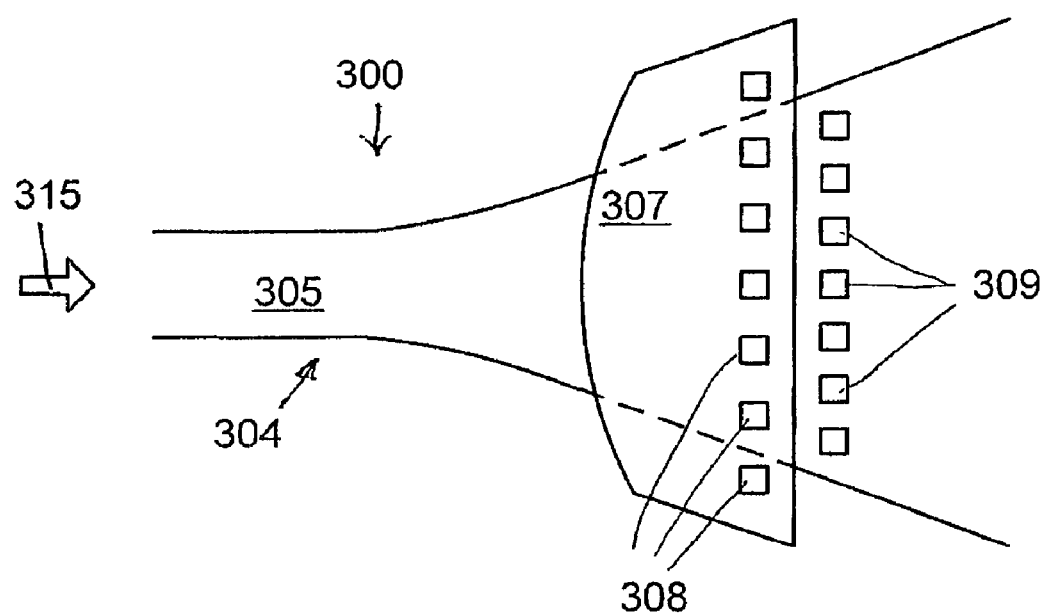
FIG. 3 is a top view of a waveguide photodetector, according to an alternate embodiment of the present invention.

FIG. 3 is a top view of a waveguide photodetector 300, not to scale, according to a preferred embodiment of the present invention. Optical signal 315 is propagated in waveguide 304, which widen as it approaches germanium 307. To simplify the fabrication of the photodetector 300, it and the waveguide 304 are made much wider than the typical width of 0.5 µm of the straight section of waveguide 304. Waveguide 304 at its widest point in the photodetector region can be several times the width of the straight section of the waveguide 304. A plurality of conductive plugs 308 are made into germanium 307. A plurality of conductive plugs 309 are made into a doped region of the silicon core 305 of the waveguide 304 on the far side of the photodetector 300, furthest away from the input for the optical signal.

Light is attenuated as it travels through the heterojunction of the photodetector 300. Placing an ohmic contact at the far end of the photodetector 300 prevents its interfering with the propagation of light into the photodetector. The conductive plugs 308 and 309 to the ohmic region are positioned away from the input into the photodetector to prevent the attenuation of the input signal. The conductive plugs 308 and 309 are also positioned to avoid the area of light penetration into the photodetector. If any of the conductive plugs 308 or 309 are within the area of light penetration in the photodetector, they will attenuate the further transmission of light, which will reduce the electric current generated by the photodetector 300.

Figure 4:
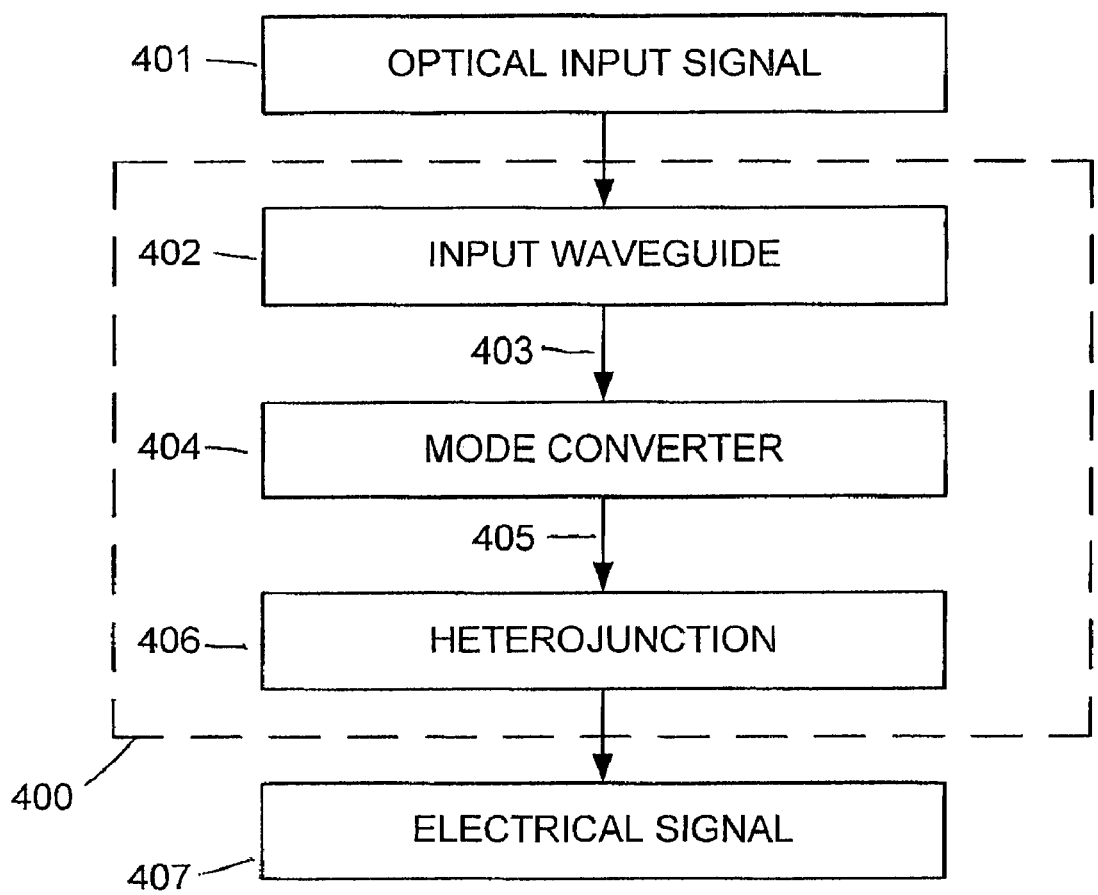
FIG. 4 is a block diagram of the operation of a waveguide photodetector, according to one embodiment of the present invention.

FIG. 4 is a block diagram of the operation of a waveguide photodetector according to an embodiment of the present invention. An optical input signal 401 is connected to input waveguide 402, which provides optical signal 403 to mode converter 404. Mode converter 404 processes optical signal 403 into modified optical signal 405, which is input to the germanium on silicon heterojunction 406. Germanium on silicon heterojunction 406 absorbs the modified optical signal 405 and generates electrical signal 407. By processing the optical signal 403, the mode converter 404 can optimize the collection efficiency of the germanium on silicon heterojunction 406.

The designs of waveguides and waveguide photodetectors can be optimized to minimize reflections, dispersions and losses. The mode converter 404 can be designed to minimize the reflections that would otherwise take place at the input to the heterojunction 406. The mode converter 404 can also be designed to make the best possible match in terms of optical modes between the optical signal 403 from the input waveguide 402 and the heterojunction 406.

The input waveguide 402 can be of the single mode or multiple mode type. The impact of a waveguide upon the mode of an optical signal can be analyzed by determining the effect of the waveguide on the: number of modes, the modal pattern and the polarization pattern, as compared to the optical signal at the input. A mode converter 404 of the present invention can optimize the modal characteristics of the signal 403 sent to the heterojunction 406, so as to send the maximum level of power into the germanium depletion region 110, as discussed with regard to FIG. 1. A single mode waveguide 401 is the preferred type for use with a photodetector of the present invention. If the optical signal 403 sent into the heterojunction 406 has a single optical mode, then the mode converter 404 can control the formation of multiple optical modes in such a way as to align the strongest mode generated with the light absorbing germanium depletion region of the heterojunction 406.

Figure 5:
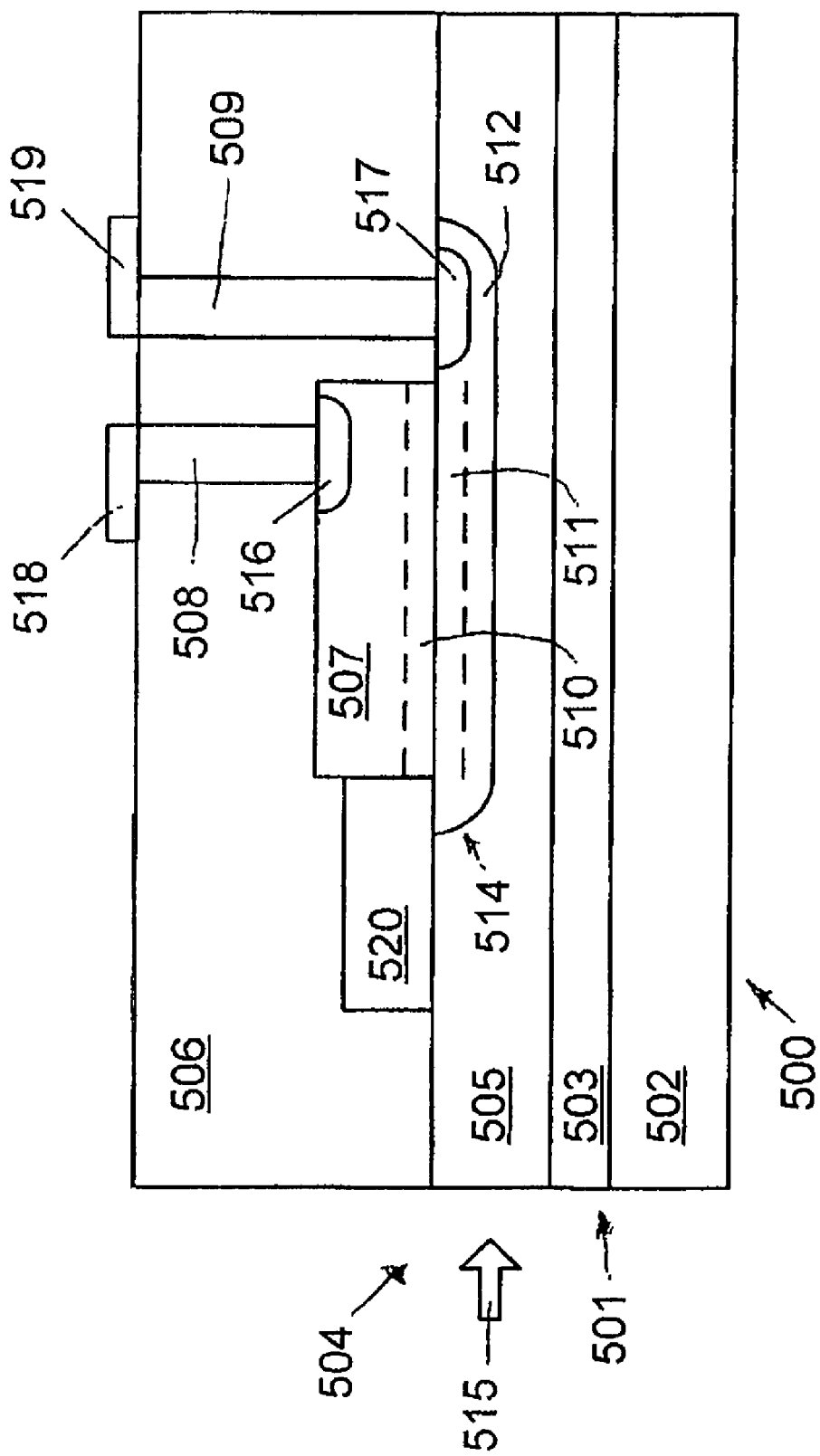
FIG. 5 is a side view of a waveguide photodetector, according to another embodiment of the present invention.

FIG. 5 is a side view of a waveguide photodetector 500, not to scale, according to an alternate embodiment of the present invention. The substrate 501 is made of silicon dioxide layer 503 on top of silicon layer 502. A silicon planar waveguide 504 receives an optical signal 515 from a source, not shown, to the left of the photodetector.

The waveguide 504 is made of a silicon core 505 surrounded by cladding in the form of one or more dielectric layers, including the silicon dioxide layer 503 underneath the silicon core. On top of silicon core 505 of waveguide 504 is a layer of germanium 507. The silicon core of the waveguide 504 and the germanium 507 are surrounded on their sides and from above by dielectric layer 506.

Conductive plug 508 extends from metal segment 518 of the first metal layer on top of the dielectric layers 506 to an ohmic contact 516 in the germanium layer 507. Conductive plug 509 extends from metal segment 519 of the first metal layer on top of the dielectric layers 506 to an ohmic contact 517 in the doped region 512 of the waveguide core 505. Each conductive plug 508 and 509 can be a plurality of conductive plugs, in order to provide the maximum pickup of electric current.

In front of the germanium 507, a mode converter 520 is disposed on top of waveguide core 505. The mode converter 520 can be made of a layer of dielectric, such as polysilicon (polycrystalline silicon). The large difference in refractive index between the silicon waveguide core 505 (n equal to about 3.5) and the silicon dioxide 503 (n equal to about 1.5) underneath the waveguide core 505 and the surrounding dielectric claddings, causes an optical signal in the waveguide core 505 to be narrowly confined. When the optical signal reaches the input or the leading edge of the germanium 507, there can be many reflections generated at the leading edge of the germanium 507, due to the abrupt change in refractive index. Depositing the mode converter 520 made of polysilicon (n equal to about 3.6) in front of the germanium 507 (n equal to about 4.2) provides a much smoother optical transition and reduces the generation of reflections at the input to the germanium 507 layer.

Figure 6:
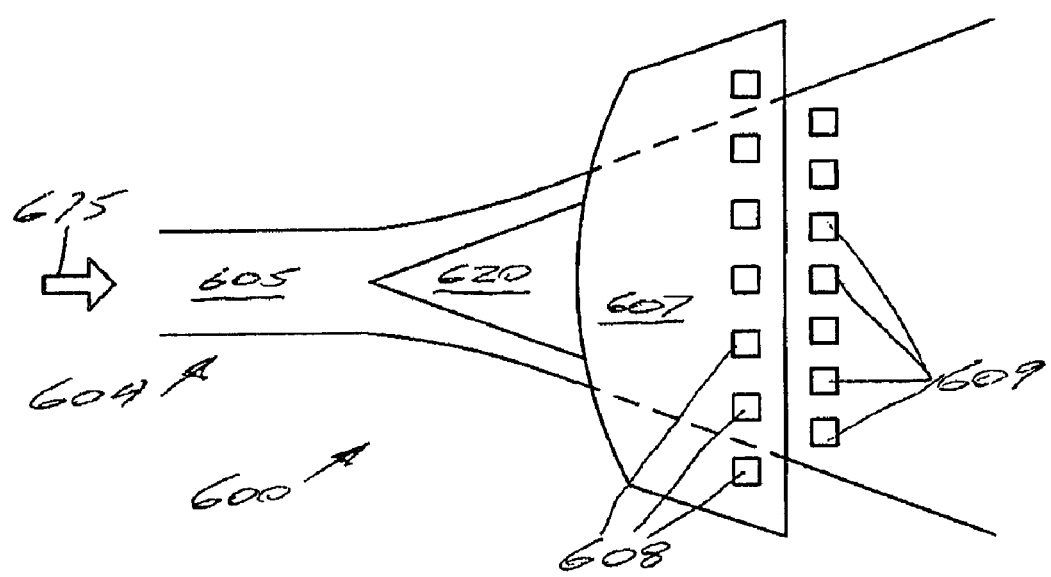
FIG. 6 is a top view of a waveguide photodetector, according to an additional embodiment of the present invention.

FIG. 6 is a top view of a waveguide photodetector 600, not to scale, according to an alternate embodiment of the present invention. Optical signal 615 is propagated in waveguide 604, which widen as it approaches germanium 607. To simplify the fabrication of the photodetector 600, it and the waveguide 604 are made much wider than the typical width of 0.5 μm of the straight waveguide 604. Waveguide 604 at its widest point in the photodetector region can be several times the typical width of the straight section of the waveguide 604. A plurality of conductive plugs 608 are made into an ohmic contact in the germanium 607. A plurality of conductive plugs 609 are made into an ohmic contact in the doped region of the silicon layer on the far side of the photodetector 600, furthest away from the input for the optical signal.

In front of the germanium 607, a mode converter 620 is disposed on top of waveguide core 605. The mode converter 620 can be made of a layer of dielectric, such as polysilicon (polycrystalline silicon). Depositing the mode converter 620 made of polysilicon (n equal to about 3.6) in front of the germanium 607 (n equal to about 4.2) provides a much smoother optical transition and reduces the generation of reflections at the input to the germanium 607 layer.

Figure 7:
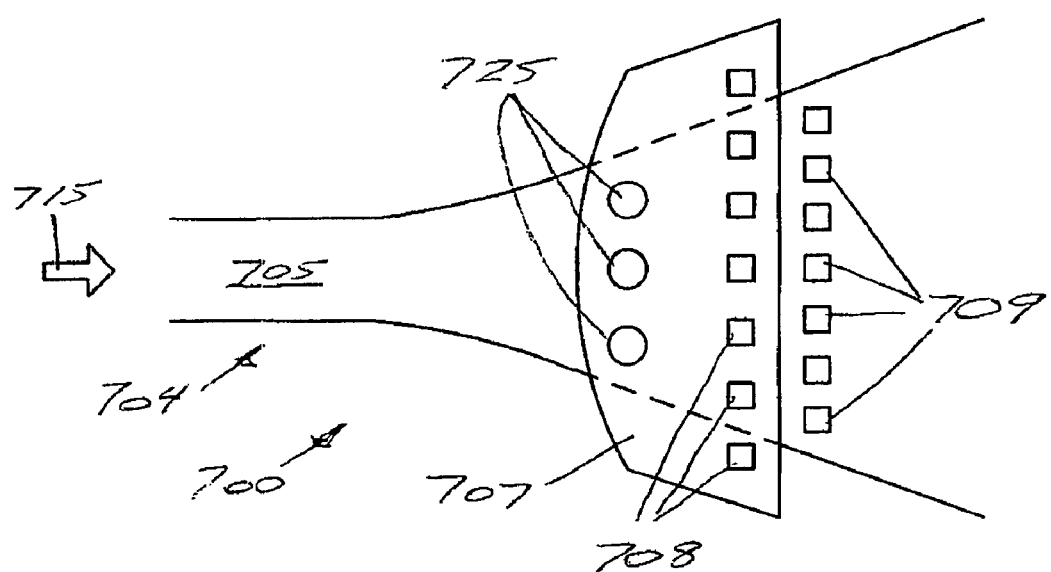
FIG. 7 is a top view of a waveguide photodetector, according to an alternate embodiment of the present invention.

FIG. 7 is a top view of a waveguide photodetector 700, not to scale, according to another embodiment of the present invention. Optical signal 715 is propagated in waveguide 704, which starts to widen as it approaches germanium 707. To simplify the fabrication of the photodetector 700, it and the waveguide 704 are made much wider than the typical width of 0.5 μm of the straight waveguide 704. Waveguide 704 at its widest point in the photodetector region can be several times the width of the straight section of the waveguide 704. A plurality of conductive plugs 708 are made into an ohmic region in germanium 707. A plurality of conductive plugs 709 are made into an ohmic contact in the doped region of the silicon core 705 on the far side of the photodetector 700, furthest away from the input for the optical signal.

Close to the leading edge of the germanium 707, where an optical signal first enters the germanium 707 from the waveguide 704, a plurality of structures 725 are formed and filled with a dielectric such as silicon dioxide. The structures 725 can be of a variety of shapes, such as cylinders, cones or other shapes. Placing silicon dioxide structures 725 with a lower refractive index (n equal to about 1.5) into the germanium (n equal to about 3.5) changes the refractive index in that region to a value somewhere between the two indices and provides for a smoother optical transition for the optical signal propagating into the germanium 707. The gradual change in refractive index will reduce the number and amplitude of the reflections generated at the boundary with the germanium 707.

The plurality of structures 725 can be placed in a number of rows and the structures 725 can typically be 300 nm in diameter and be spaced at a distance of 500 nm between their approximate center lines. Each successive row of structures 725 can be thinner and spaced farther apart to provide a gradual transition. The size and arrangement of the structures 725 need not be in a regular pattern, but can be irregular or random, as may be needed to obtain a smooth optical transition.

Figure 8:
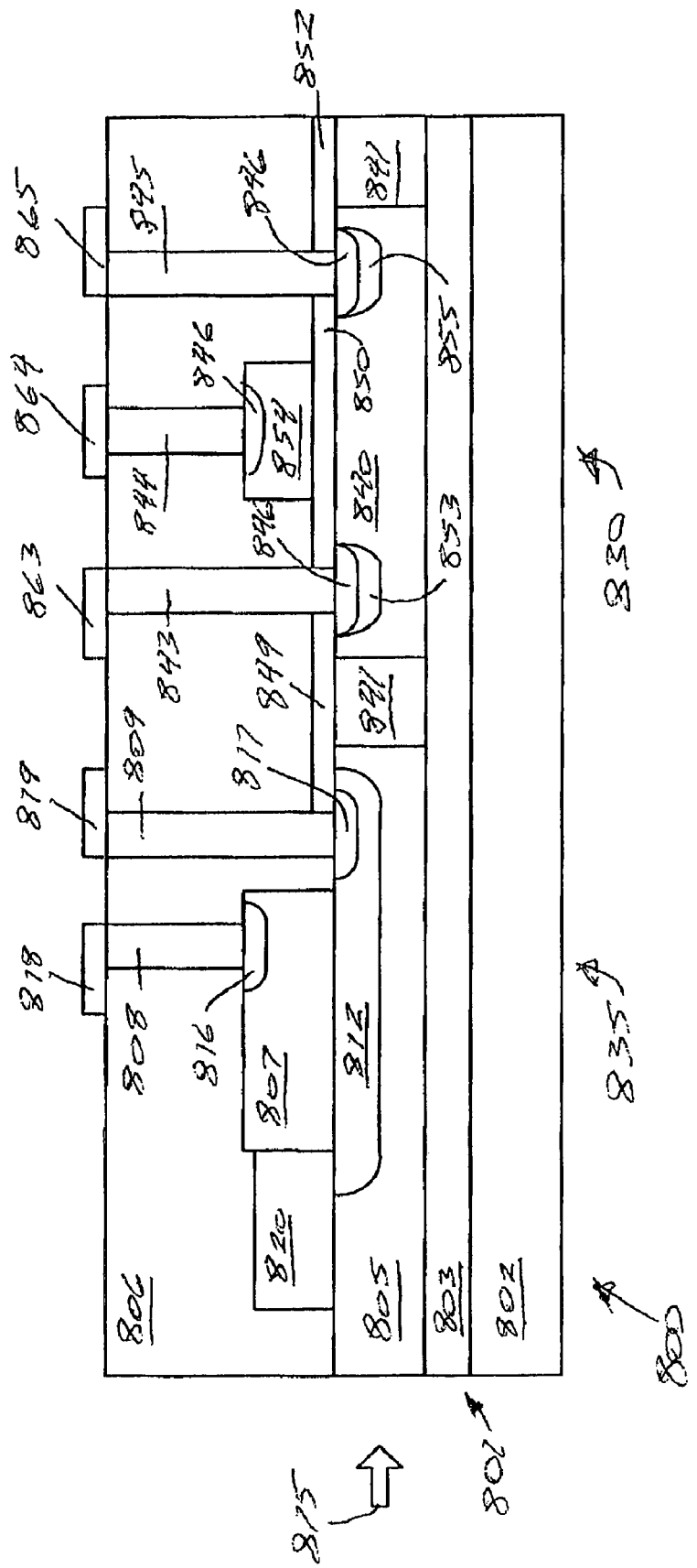
FIG. 8 is a side view of a waveguide photodetector integrated with a CMOS transistor, according to one embodiment of the present invention.

FIG. 8 is a side view of a waveguide photodetector integrated with a CMOS transistor, according to one embodiment of the present invention. Optoelectronic circuit 800 is comprised of waveguide photodetector 835 and CMOS transistor 830. The substrate 801 is made of silicon dioxide layer 803 on top of silicon layer 802. A silicon planar waveguide 804 receives an optical signal 815 from a source, not shown, to the left of the photodetector.

The waveguide 804 is made of silicon core 805 surrounded by cladding in the form of one or more dielectric layers, including the silicon dioxide layer 803 underneath the silicon core. On top of silicon core 805 is a layer of germanium 807. The germanium on silicon heterojunction is surrounded on its sides and from above by cladding consisting of one or more dielectric layers 806. The dielectric layers 806 can also be referred to as inter-layer dielectric (ILD) films.

An ohmic contact 816 is implanted into the germanium 807. A conductive plug 808 extends from metal segment 818 of the first metal layer on top of the dielectric layers 806 to the ohmic contact 816. An ohmic contact 817 is made of metal silicide in the doped region 812 of the silicon core 805. Conductive plug 809 extends from metal segment 819 of the first metal layer on top of the dielectric layers 806 to ohmic contact 817. Conductive plugs 808 and 809 can be made of tungsten or other conductive material. Each conductive plug 808 and 809 is a plurality of conductive plugs, in order to provide for the maximum pickup of electric current.

In front of the germanium 807, a layer of dielectric such as polysilicon 820 is disposed on top of waveguide 804. The polysilicon 820 layer in front of the germanium 807 operates as a mode converter and provides for a smoother optical transition and reduces the generation of reflections at the start of the germanium 807 layer.

CMOS transistor 830 is comprised of silicon body 840, which includes a doped region 853 for a drain, polysilicon region 854 for a gate and doped region 855 for a source. Ohmic contacts 846 are disposed into the regions 853, 854 and 855. Ohmic contacts 846 can be made of metal silicide or other suitable material. Contacts 843, 844 and 845 extend from the ohmic contacts 846 to the respective metal segments 863, 864 and 865, which are part of the first metal layer. Contacts 843, 844 and 845 can be made of tungsten or other conductive material.

A local interconnection 849 connects conductive plug 809 to conductive plug 843, thus connecting the photodetector 835 and the transistor 830. Any of the ohmic contacts 846 or the metal segments of the first metal layer 843, 844 or 845 can connect to other devices on a CMOS chip, such as: resistors, capacitors, inductors, diodes or other transistors. Local interconnection 852 connects the transistor's drain ohmic contact 846 to other devices on the integrated circuit 800.

Isolation dielectric 841 surrounds the sides of the body 840 of CMOS transistor 830. Inter-layer dielectric films 806 are deposited on top of the body 840 and gate 854. Gate spacer material 850 is a dielectric.

The body 840 of a CMOS transistor 830 can be fabricated at the same time as the silicon core 805 of waveguide 804. The isolation dielectric 841 of a CMOS transistor 830 can be fabricated at the same time as the side cladding 841 made of dielectric on the side of the waveguide core 805. The insulator 803 of the SOI substrate 801 is used as the insulator underneath the CMOS transistor 830 and also as the bottom cladding of the photodetector 835. The inter-layer dielectric films 806 of the CMOS transistor 830 can be fabricated at the same time as the top cladding films 806 of the photodetector 835.

The conductive plugs 843, 844 and 845 extend from respective metal segments 863, 864 and 865 to the drain, gate and source of the CMOS transistor. The conductive plugs 843, 844 and 845 are fabricated at the same time as the conductive plugs 808 and 809 to the photodetector 835. The ohmic contacts 846 to the drain and source of the CMOS transistor can be fabricated at the same time as the ohmic contacts 816 and 817 of the photodetector 835. The local interconnection 852 made between CMOS transistor 830 and other components on the chip can be fabricated at the same time as the local interconnection 849 from the CMOS transistor 830 to the photodetector 835.

The doping of the drain region 853 and the source region 855 of the CMOS transistor 830 can be performed at the same time as the doping of the doped region 812 of the photodetector 835.

The polysilicon gate layer 854 of the CMOS transistor 830 can be fabricated at the same time as the polysilicon mode converter 820 of the photodetector 835.

Figure 9:
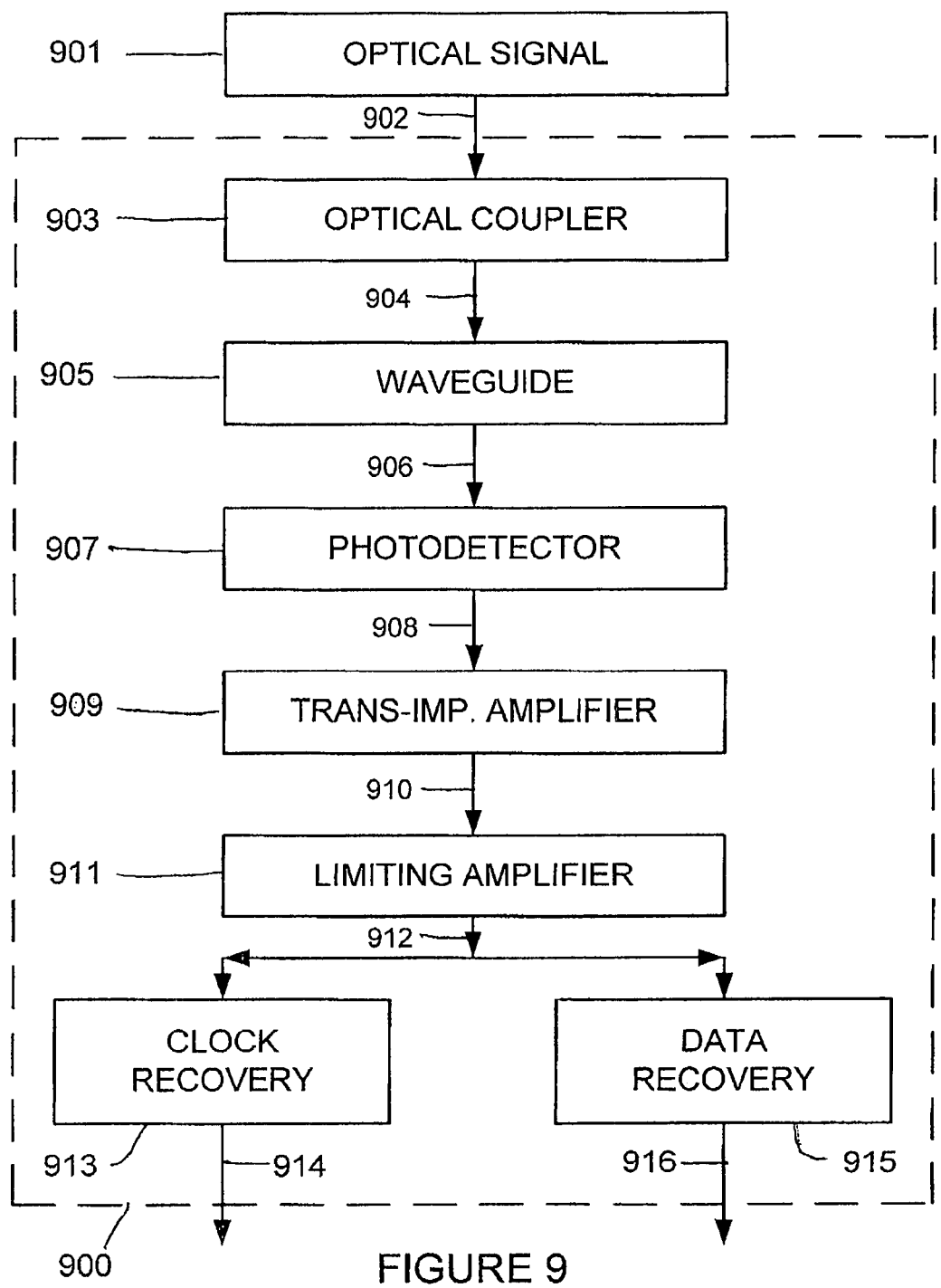
FIG. 9 is a block diagram of the operation of an integrated, monolithic optoelectronic converter, according to one embodiment of the present invention.

FIG. 9 is a block diagram of an integrated, monolithic optoelectronic converter, according to a preferred embodiment of the present invention. A monolithic CMOS integrated circuit 900 receives an optical signal 901 from an optical transport such as a fiber optic cable 902. The fiber optic cable 902 is connected to an optical coupler 903 on the chip 900. The optical coupler 903 sends the optical signal 904 to planar waveguide 905. The optical coupler 903 can preferably connect to the chip 900 at the surface of the chip, or alternately at the edge of the chip. The optical signal 904 propagates through waveguide 905 until the optical signal 906 reaches a waveguide photodetector 907 of the present invention. Waveguide photodetector 907 converts the optical signal 906 to an electrical signal 908.

Electrical signal 908 is amplified by trans-impedance amplifier 909 and sent as amplified signal 910 to limiting amplifier 911. The output of limiting amplifier 911 is digital signal 912, which is processed by clock recovery circuit 913 to recover a clock 914 encoded in the digital signal 912. The digital signal 912 is also processed by data recovery circuit 915 to recover the digital data 916.

The encoding and recovery of clock and data signals into a digital signal can be accomplished by a variety of methods and techniques and is well known to those skilled in the art, and need not be further discussed herein.

In alternate embodiments, the chip 900 could be smaller or larger in terms of size and functionality. The chip 900 could send the electrical signal 908 output, or the amplified signal 910 or the digital signal 912 to another chip for further processing. The chip 900 could also contain other digital circuitry, such as repeater, computational, digital signal processing or other systems, such as a digital to optical converter.

A particularly advantageous aspect of the present invention is that the fabrication of germanium on silicon waveguide photodetectors on SOI (silicon on insulator) substrates makes possible the integration of such photodetectors with CMOS circuits.

Another particularly advantageous aspect of the present invention is that the germanium on silicon waveguide photodetector is built on the same CMOS chip as the CMOS electronic circuits that process the output of the photodetector, thus eliminating the need for hybrid circuits. Such integrated optoelectronic chips with small size photonic elements of less than 1 µm in width, are much cheaper and faster than the equivalent hybrid chips.

Although the present invention has been described in detail, it should be understood that various changes, substitutions and alterations can be made without departing from the spirit and scope of the invention.

We claim:

1. A method for communicating signals to a semiconductor device using optical signals comprising:
   sending an optical signal to an input of a germanium on silicon waveguide photodetector located on a semiconductor chip, said germanium on silicon waveguide photodetector comprising:
   a waveguide comprising:
   a core comprised of a germanium on silicon heterojunction stack comprising:
   a silicon layer comprising substantially silicon for conducting light, and
   a germanium layer comprising substantially germanium for conducting light; and
   a cladding comprised of a plurality of dielectric materials;
   an optical input;
   a first plurality of conductive contacts coupled to said germanium layer; and
   a second plurality of conductive contacts coupled to said silicon layer; and,
      outputting an electrical signal through at least one of the second plurality of conductive contacts of the germanium on silicon waveguide photodetector to an input of a semiconductor device located on the semiconductor chip.

2. A method for communicating signals to a semiconductor device using optical signals comprising:
   receiving an optical signal at an input of a germanium on silicon waveguide photodetector located on a semiconductor chip, said germanium on silicon waveguide photodetector comprising:
   a waveguide comprising:
   a core comprised of a germanium on silicon heterojunction stack comprising:
   a silicon layer comprising substantially silicon for conducting light, and
   a germanium layer comprising substantially germanium for conducting light; and
   a cladding comprised of a plurality of dielectric materials;
   an optical input;
   a first plurality of conductive contacts coupled to said germanium layer; and
   a second plurality of conductive contacts coupled to said silicon layer; and,
      outputting an electrical signal through at least one of the second plurality of conductive contacts of the germanium on silicon waveguide photodetector to an input of a semiconductor device located on the semiconductor chip.

3. A method for communicating signals to a semiconductor device using optical signals comprising:
   sending an optical signal to an input of a germanium on silicon waveguide photodetector located on a semiconductor chip, said germanium on silicon waveguide photodetector comprising:
   a waveguide comprising:
   a core comprised of a germanium on silicon heterojunction stack comprising:
   a silicon layer comprising substantially silicon for conducting light, and
   a germanium layer comprising substantially germanium for conducting light; and
   a cladding comprised of a plurality of dielectric materials;
   an optical input;
   a first plurality of conductive contacts coupled to said germanium layer; and
   a second plurality of conductive contacts coupled to said silicon layer; and,
      outputting an electrical signal through at least one of the first plurality of conductive contacts of the germanium on silicon waveguide photodetector to an input of a semiconductor device located on the semiconductor chip.

4. A method for communicating signals to a semiconductor device using optical signals comprising:
   receiving an optical signal at an input of a germanium on silicon waveguide photodetector located on a semiconductor chip, said germanium on silicon waveguide photodetector comprising:
   a waveguide comprising:
   a core comprised of a germanium on silicon heterojunction stack comprising:
   a silicon layer comprising substantially silicon for conducting light, and
   a germanium layer comprising substantially germanium for conducting light; and
   a cladding comprised of a plurality of dielectric materials;
   an optical input;
   a first plurality of conductive contacts coupled to said germanium layer; and
   a second plurality of conductive contacts coupled to said silicon layer; and,
      outputting an electrical signal through at least one of the first plurality of conductive contacts of the germanium on silicon waveguide photodetector to an input of a semiconductor device located on the semiconductor chip.

5. A method for communicating signals to a semiconductor device using optical signals comprising:
   sending an optical signal to an input of a germanium on silicon waveguide photodetector located on a semiconductor chip, said germanium on silicon waveguide photodetector comprising:
   a waveguide comprising:
   a core comprised of a germanium on silicon heterojunction stack comprising:
   a silicon layer comprising substantially silicon for conducting light, and
   a germanium layer comprising substantially germanium for absorbing light; and
   a cladding comprised of a plurality of dielectric materials;
   an optical input;
   a first plurality of conductive contacts coupled to said germanium layer; and
   a second plurality of conductive contacts coupled to said silicon layer; and,
      outputting an electrical signal through at least one of the second plurality of conductive contacts of the germanium on silicon waveguide photodetector to an input of a semiconductor device located on the semiconductor chip.

6. A method for communicating signals to a semiconductor device using optical signals comprising:
   receiving an optical signal at an input of a germanium on silicon waveguide photodetector located on a semiconductor chip, said germanium on silicon waveguide photodetector comprising:
   a waveguide comprising:
   a core comprised of a germanium on silicon heterojunction stack comprising:

a silicon layer comprising substantially silicon for conducting light, and a germanium layer comprising substantially germanium for absorbing light; and a cladding comprised of a plurality of dielectric materials;

an optical input;

a first plurality of conductive contacts coupled to said germanium layer; and a second plurality of conductive contacts coupled to said silicon layer; and, outputting an electrical signal through at least one of the second plurality of conductive contacts of the germanium on silicon waveguide photodetector to an input of a semiconductor device located on the semiconductor chip.

* * * * *